United States Patent
Huang

(10) Patent No.: US 10,818,876 B2
(45) Date of Patent: Oct. 27, 2020

(54) ORGANIC LIGHT-EMITTING DIODE (OLED) DISPLAY PANEL AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Hui Huang, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 203 days.

(21) Appl. No.: 16/091,014

(22) PCT Filed: Sep. 12, 2018

(86) PCT No.: PCT/CN2018/105330
§ 371 (c)(1),
(2) Date: Oct. 3, 2018

(87) PCT Pub. No.: WO2019/205426
PCT Pub. Date: Oct. 31, 2019

(65) Prior Publication Data
US 2020/0168842 A1    May 28, 2020

(30) Foreign Application Priority Data
Apr. 25, 2018 (CN) .......................... 2018 1 0381653

(51) Int. Cl.
*H01L 51/52* (2006.01)
*H01L 51/56* (2006.01)
(Continued)

(52) U.S. Cl.
CPC ...... *H01L 51/5275* (2013.01); *H01L 51/5256* (2013.01); *H01L 51/56* (2013.01);
(Continued)

(58) Field of Classification Search
CPC ............. H01L 27/3244; H01L 51/5275; H01L 51/5253–5256; H01L 51/56
See application file for complete search history.

(56) References Cited

U.S. PATENT DOCUMENTS 6,872,473 B2 * 3/2005 Song ................... H01L 51/5253
257/100
9,065,072 B2 * 6/2015 Song ................... H01L 51/5253
(Continued)

FOREIGN PATENT DOCUMENTS

CN    103996696 A    8/2014
CN    104103776 A    10/2014

*Primary Examiner* — Errol V Fernandes
*Assistant Examiner* — Jeremy J Joy
(74) *Attorney, Agent, or Firm* — Leong C. Lei

(57) ABSTRACT

The present disclosure relates to an organic light-emitting diode (OLED) display panel, including: a substrate, an OLED array layer configured on the substrate, a thin film packaging layer configured on the substrate and the OLED array layer, and a light extraction layer configured within the thin film packaging layer. The OLED array layer includes a plurality of OLED components arranged in matrix. The thin film packaging layer includes at least two inorganic barrier layers and at least one organic buffer layer. One side of the inorganic barrier layer facing away the substrate includes a plurality of pixel grooves corresponding to tops of each of the OLED components. The light extraction layer is configured within the pixel grooves, and the light extraction layer is covered by a flattening film configured to seal the light extraction layer within the pixel grooves, so as to flatten a surface of the inorganic barrier layer.

10 Claims, 5 Drawing Sheets

(51) Int. Cl.
*H01L 51/00* (2006.01)
*H01L 27/32* (2006.01)

(52) U.S. Cl.
CPC ......... *H01L 27/322* (2013.01); *H01L 27/3211* (2013.01); *H01L 27/3244* (2013.01); *H01L 51/0097* (2013.01); *H01L 2227/323* (2013.01)

(56) References Cited

U.S. PATENT DOCUMENTS

| | | | |
|---|---|---|---|
| 9,065,076 B2* | 6/2015 | Lee | H01L 51/5275 |
| 9,406,905 B2* | 8/2016 | Park | H01L 51/5253 |
| 2007/0077349 A1* | 4/2007 | Newman | B82Y 20/00 |
| | | | 427/66 |
| 2013/0207083 A1* | 8/2013 | Young | H01L 51/5246 |
| | | | 257/40 |
| 2014/0117330 A1* | 5/2014 | Cho | H01L 51/56 |
| | | | 257/40 |
| 2014/0183462 A1* | 7/2014 | Lee | H01L 51/5253 |
| | | | 257/40 |
| 2015/0021559 A1* | 1/2015 | Han | H01L 51/524 |
| | | | 257/40 |
| 2016/0218323 A1* | 7/2016 | Seo | H01L 51/5275 |
| 2017/0024466 A1* | 1/2017 | Bordawekar | G06F 40/216 |
| 2017/0250376 A1* | 8/2017 | Sasaki | H01L 51/5275 |
| 2017/0271623 A1* | 9/2017 | Wang | H01L 51/5275 |
| 2018/0007747 A1* | 1/2018 | Jung | H01L 51/5256 |
| 2018/0158879 A1* | 6/2018 | Kim | H01L 51/5237 |
| 2018/0277609 A1* | 9/2018 | Fukiwara | H01L 27/326 |
| 2018/0350883 A1* | 12/2018 | Lee | G02B 1/11 |

* cited by examiner

ORGANIC LIGHT-EMITTING DIODE (OLED) DISPLAY PANEL AND MANUFACTURING METHOD THEREOF

RELATED APPLICATIONS

The present application is a National Phase of International Application Number PCT/CN2018/105330, filed Sep. 12, 2018, and claims the priority of China Application No. 201810381653.7, filed Apr. 25, 2018.

BACKGROUND

1. Technical Field

The present disclosure relates to display field, more particularly to an organic light-emitting diode (OLED) display panel and a manufacturing method thereof.

2. Description of Related Art

Active matrix flat panel displays have been widely adopted due to the attributes, such as thin, low power consuming, and no radiation. The organic light-emitting diode (OLED) display technique is a promising technique having an excellent display performance, and is referred to as "the dream display" due to the attributes, such as self-luminous, simple structure, ultra-lightweight, fast response, wide viewing angle, low power consuming, and capable of achieving flexible display. In addition, the OLED display devices have adopted by major of manufacturers and have become the main product of the third generation display devices in the display field due to the manufacturing cost of the OLED display devices is much less than that of the thin film transistor liquid crystal display (TFT-LCD). With the development of new technologies, the OLED display device will have a breakthrough development.

The difference the plurality of the OLED display device and the traditional LCD resides in that the OLED display device does not require a backlight. The OLED display adopts a thin organic material coating layer and a glass substrate. The organic material may illuminate when a current pass through. However, the organic material may easily react with water vapor or oxygen. Since the OLED display screen is an organic material-based display device, the OLED display has a very high requirement for packaging. Generally, the OLED display screen requires to be packaged at 85° C. and under the condition that the water vapor transmission rate (WVTR) is less than $10^{-6}$ g/m$^2$/day under 85 relative humidity (RH). The internal sealing of the device may be improved by packaging the OLED components, such that the OLED component may be isolated from the external environment, which is important for the OLED component to illuminate.

Conventionally, the packaging of OLED components is mainly conducted on a hard package cover (such as glass or metal) by a packaging adhesive. However, this method is not applicable to the flexible device. Therefore, in another technical solution, the OLED component is packaged through the stacked thin films. Generally, a plurality of inorganic barrier layers, which are made of inorganic material and have good gas-barrier and gas-barrier properties, are formed on the OLED component, and an organic buffer layer, which is made of organic material and has a good flexibility, is formed the plurality of the two inorganic barrier layers.

Although the OLED device has attributes, it also has defects, such as low photon utilization. About 80% of photons cannot escape into the air due to the influences of the reflection and refraction of the indium tin oxide (ITO), the glass substrate, and the various functional layers inside the OLED device, which may result in the low photon utilization. In order to improve the light extraction efficiency of the device, researchers have proposed many methods, such as changing the structure of the electrodes of the device, inserting a light extraction layer inside the OLED, and etching various microstructures on the surface of the substrate. These methods can improve the light extraction efficiency of OLED, however, the processes of these methods are complicated, and they are difficult to be achieved in practical applications, and changing the internal structure or etching may affect the performance of the OLED.

SUMMARY

In one aspect, the present disclosure relates to an OLED display panel, including: a substrate, an OLED array layer configured on the substrate, a thin film packaging layer configured on the substrate and the OLED array layer, and a light extraction layer configured within the thin film packaging layer. The OLED array layer includes a plurality of OLED components arranged in matrix, the thin film packaging layer includes at least two inorganic barrier layers and at least one organic buffer layer, one side of the inorganic barrier layer facing away the substrate includes a plurality of pixel grooves corresponding to tops of each of the OLED devices, the light extraction layer is configured within the pixel grooves, and the light extraction layer is covered by a flattening film configured to seal the light extraction layer within the pixel grooves, so as to flatten a surface of the inorganic barrier layer.

A number of the organic buffer layer is one less than a number of the inorganic barrier layer in the thin film packaging layer, the inorganic barrier layer and the organic buffer layer are stacked in an alternative manner, and a most-bottom layer of the thin film packaging layer is configured to be the inorganic barrier layer. The thin film packaging layer includes at least two inorganic barrier layers, and the plurality of the pixel grooves are configured on the inorganic barrier layer sandwiched between the two organic buffer layers.

The thin film packaging layer includes three inorganic barrier layers, the plurality of the pixel grooves are configured on a second inorganic barrier layer arranged along a direction from a bottom to a top, in the thin film packaging layer, and the light extraction layer is configured within the second inorganic barrier layer arranged along the direction from the bottom to the top.

The light extraction layer is made of titanium dioxide sol, magnesium oxide sol, or an organic solution. The flattening film is made of the same material with the inorganic barrier layer. The inorganic barrier layer is made of silicon nitride. The organic buffer layer is made of silicon carbon nitride or silicon oxide carbon.

The OLED display panel further includes a thin film transistor (TFT) layer configured between the substrate and the OLED array layer, and the OLED array layer is configured on the TFT layer. The substrate is a flexible substrate. The OLED components include: a plurality of red OLED components, a plurality of green OLED components, and a plurality of blue OLED components, or the OLED components are configured to be white OLED components, and the OLED display panel further includes a color filter layer configured within the thin film packaging layer.

In another example, the present disclosure relates to a manufacturing method of an OLED display panel, including: step S1, providing a substrate and forming an OLED array layer on the substrate, wherein the OLED array layer includes a plurality of OLED components arranged in matrix, step S2, forming a thin film packaging layer on the substrate and the OLED array layer, and forming a light extraction layer within the thin film packaging layer when forming the thin film packaging layer. The thin film packaging layer includes at least two inorganic barrier layers and at least one organic buffer layer, a plurality of pixel grooves are formed on one side of the inorganic barrier layer facing away the substrate when forming the thin film packaging layer, and the plurality of the pixel grooves correspond to tops of each of the OLED components. Light extraction material is injected into the pixel grooves to form the light extraction layer, and inorganic material is filled within the pixel grooves to form a flattening film configured to cover the light extraction layer, so as to flatten a surface of the inorganic barrier layer.

A number of the organic buffer layer is one less than a number of the inorganic barrier layer in the thin film packaging layer, the inorganic barrier layer and the organic buffer layer are stacked in an alternative manner, and a most-bottom layer of the thin film packaging layer is configured to be the inorganic barrier layer. The thin film packaging layer includes at least two inorganic barrier layers, and the plurality of the pixel grooves are configured on the inorganic barrier layer sandwiched between the two organic buffer layers. The inorganic barrier layer is manufactured by conducting a chemical vapor deposition (CVD) process. In the step S2, the plurality of the pixel grooves are formed on the inorganic barrier layer by conducting a patterned process, wherein the patterned process includes a photoresist-coating process, an exposure process, a development process, an etching process, and a photoresist-removing process conducted in sequence.

The thin film packaging layer includes three inorganic barrier layers, the plurality of the pixel grooves are configured on a second inorganic barrier layer arranged along a direction from a bottom to a top, in the thin film packaging layer, and the light extraction layer is configured within the second inorganic barrier layer, arranged along the direction from the bottom to the top.

In step S2, the light extraction material is titanium dioxide sol, magnesium oxide sol, or an organic solution, and the light extraction layer is manufactured by conducting a coating process, an evaporation process, or a spraying process. The flattening film is made of the same material with the inorganic barrier layer. The inorganic barrier layer is made of silicon nitride. The organic buffer layer is made of silicon carbon nitride or silicon oxide carbon.

The step S1 further includes forming a TFT layer on the substrate before forming the OLED array layer, and the OLED array layer is configured on the TFT layer. The substrate is a flexible substrate. The OLED components include: a plurality of red OLED components, a plurality of green OLED components, and a plurality of blue OLED components, or the OLED components are configured to be white OLED components, and the OLED display panel further includes a color filter layer configured within the thin film packaging layer.

In view of the above, the present disclosure relates to the OLED display panel, including: the substrate, the OLED array layer configured on the substrate, the thin film packaging layer configured on the substrate and the OLED array layer, and the light extraction layer configured in the thin film packaging layer. The thin film packaging layer includes the inorganic barrier layer and the organic buffer layer. One side of the inorganic barrier layer facing away the substrate includes a plurality of pixel grooves corresponding to tops of each of the OLED components. The light extraction layer is configured within the pixel grooves. The light extraction layer is covered by the flattening film configured to seal the light extraction layer within the pixel groove, so as to flatten the surface of the inorganic barrier layer. As such, the packaging performance of the thin film packaging layer may not be affected, the stability of the light extraction layer may be improved, the light extraction layer may be prevented from being damaged by water vapor and oxygen, and the damage of the internal organic film layer, resulting from placing the light extraction layer in the OLED component in the prior art, may be avoided, and the light extraction layer may correspond to the OLED component one-by-one. The present disclosure further relates to the manufacturing method of the OLED display panel configured to manufacture the light extraction layer inside the thin film packaging layer. As such, the packaging performance of the thin film packaging layer may not be affected, the stability of the light extraction layer may be improved, the damage of the internal organic film layer, resulting from placing the light extraction layer in the OLED component in the prior art, may be avoided, and the light extraction layer may correspond to the OLED component one-by-one.

DETAILED DESCRIPTION

To clarify the purpose, technical solutions, and the advantages of the disclosure, embodiments of the invention will now be described more fully hereinafter with reference to the accompanying drawings.

Figure 1:
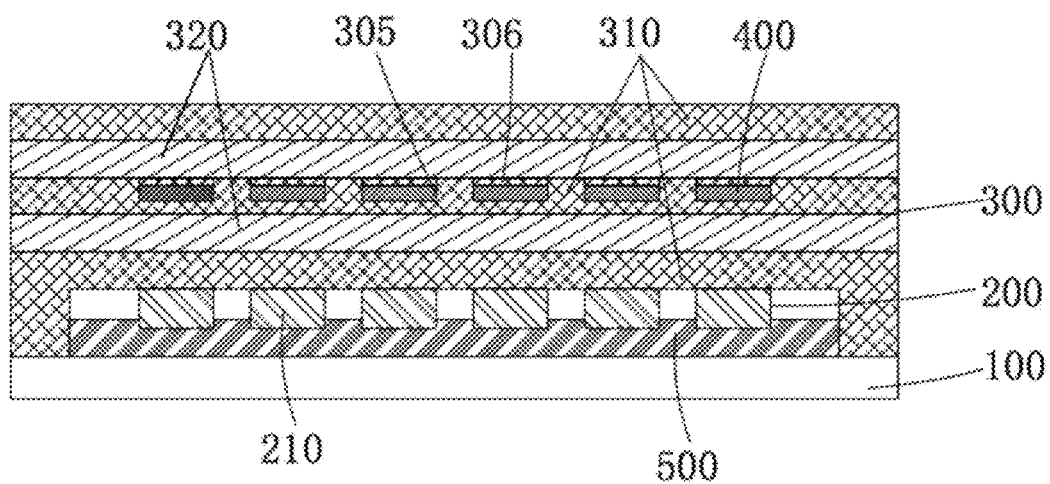
FIG. 1 is a schematic view of an organic light-emitting diode (OLED) display panel in accordance with one embodiment of the present disclosure.

Referring to FIG. 1, the present disclosure relates to an organic light-emitting diode (OLED) display panel, including: a substrate 100, a thin film transistor (TFT) layer 500 configured on the substrate 100, an OLED array layer 200 configured on the TFT layer 500, a thin film packaging layer 300 configured on the substrate 100 and the OLED array layer 200, and a light extraction layer 400 configured within the thin film packaging layer 300, wherein the thin film packaging layer 300 covers the OLED array layer 200. The light extraction layer 400 is configured to change a total reflection angle, as such light limited within the OLED display panel due to the total reflection may be refracted and extracted, so as to improve light extraction efficiency of the OLED display panel.

Specifically, the OLED array layer 200 may include a plurality of OLED components 210 arranged in matrix.

The thin film packaging layer 300 may include at least two inorganic barrier layers 310 and at least one organic buffer layer 320. A number of the organic buffer layer 320 is one less than a number of the inorganic barrier layer 310. The inorganic barrier layer 310 and the organic buffer layer 320 are stacked in an alternative manner. A most-bottom layer of the thin film packaging layer 300 is configured to be the inorganic barrier layer 310. One side of the inorganic barrier layer 310 facing away the substrate includes a plurality of pixel grooves 305 respectively corresponding to tops of each of the OLED components 210.

Specifically, the light extraction layer 400 is configured within the pixel grooves 305. The light extraction layer 400 is covered by a flattening film 306 configured to seal the light extraction layer 400 within the pixel grooves 305, so as to flatten a surface, having the plurality of the pixel grooves 305, of the inorganic barrier layer 310. As such, the inorganic barrier layer 310 may have a uniform thickness, the light extraction layer 400 may be guaranteed to be configured within the thin film packaging layer 300, and an interlayer stress between the light extraction layer 400 and the thin film packaging layer 300, and damages of package may be avoided.

The flattening film 306 is made of the same material with the inorganic barrier layer 310.

In one example, the plurality of the pixel grooves 305 may be configured on the most-bottom layer of the inorganic barrier layer 310. That is the light extraction layer 400 may be configured within the most-bottom layer of the inorganic barrier layer 310. However, this may increase difficulties of manufacturing. Certain damages may be caused on the OLED components 210 during the manufacturing process of the light extraction layer 400 due to the inorganic barrier layer 310 is the closet layer to the OLED array layer 200. In another example, the plurality of the pixel grooves 305 may be configured on a most-top layer of the inorganic barrier layer 310. That is, the light extraction layer 400 is configured within the most-top layer of the inorganic barrier layer 310. However, the light extraction layer 400 is only covered by the flattening film 306, and the light extraction layer 400 may not be perfectly isolated from water vapor and oxygen. Therefore, the thin film packaging layer 300 may include at least two inorganic barrier layers 310. The plurality of the pixel grooves 305 is configured on the inorganic barrier layer 310, which is arranged between the most-top layer and the most-bottom layer of the inorganic barrier layer 310. In other words, the light extraction layer 400 is configured on the middle inorganic barrier layer 310.

In one example, the thin film packaging layer 300 may include three inorganic barrier layers 310. The plurality of the pixel grooves 305 are configured on a second inorganic barrier layer 310 arranged along a direction from a bottom to a top. That is, the light extraction layer 400 is configured within the second inorganic barrier layer 310 arranged along the direction from the bottom to the top.

Specifically, the light extraction layer 400 is made of inorganic material (such as titanium dioxide sol and magnesium oxide sol) or an organic solution.

The inorganic barrier layer 310 is made of silicon nitride (SiNx), which is capable of blocking the water vapor and oxygen, but the present disclosure is not limited thereto.

The organic buffer layer 320 is made of silicon carbon nitride (SiCN) or silicon oxide carbon (SiOC).

In one example, the OLED display panel may be a flexible display panel, and the substrate 100 may be a flexible substrate.

Specifically, the OLED display panel is configured to display color images via a side-by-side structure of red-colored sub-pixels, green-colored sub-pixels, and blue-colored sub-pixels. In one example, the plurality of the OLED components 210 may include: a plurality of red OLED components, a plurality of green OLED components, and a plurality of blue OLED components.

In another example, the OLED display panel is configured to display the color images via a tandem structure including a white organic light emitting diode (WOLED) and a color filter (CF) stacked layer-by-layer. The OLED components 210 are configured to be white OLED components. The OLED display panel may further include a color filter layer configured within the thin film packaging layer 300.

In the OLED display panel of the present disclosure, the light extraction layer 400 is configured within the thin film packaging layer 300. As such, the packaging performance of the thin film packaging layer 300 may not be affected, the stability of the light extraction layer 400 may be improved, the light extraction layer 400 may be prevented from being damaged by water vapor and oxygen, and the damage of the internal organic film layer, resulting from placing the light extraction layer 400 in the OLED component 210 in the prior art, may be avoided, and the light extraction layer 400 may correspond to the OLED component 210 one-by-one.

Figure 2:
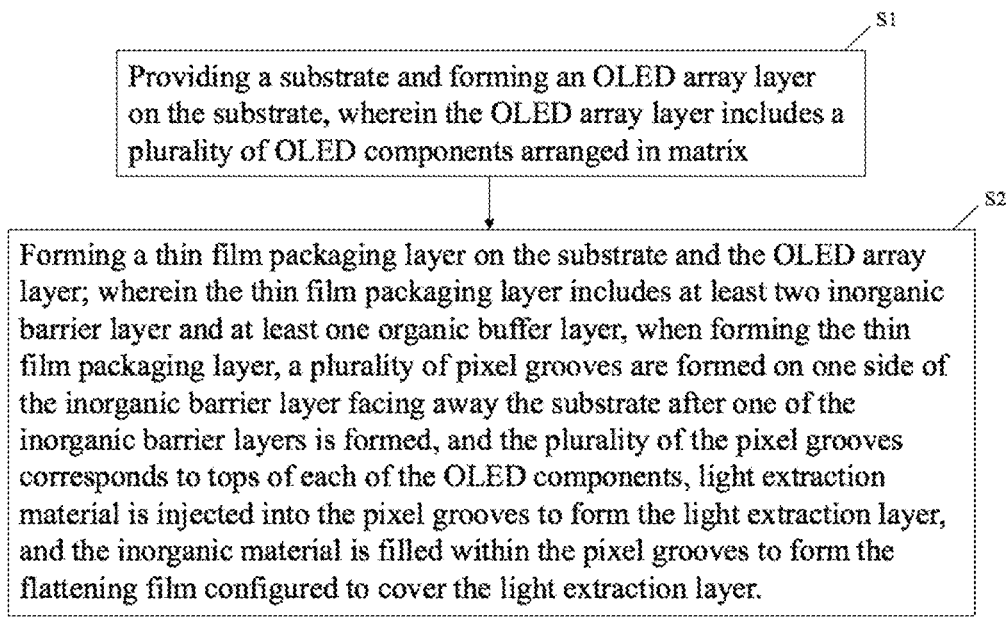
FIG. 2 is a flowchart illustrating a manufacturing method of an OLED display panel in accordance with one embodiment of the present disclosure.

Referring to FIG. 2, the present disclosure further relates to a manufacturing method of the OLED display panel, including the following steps.

Figure 3:
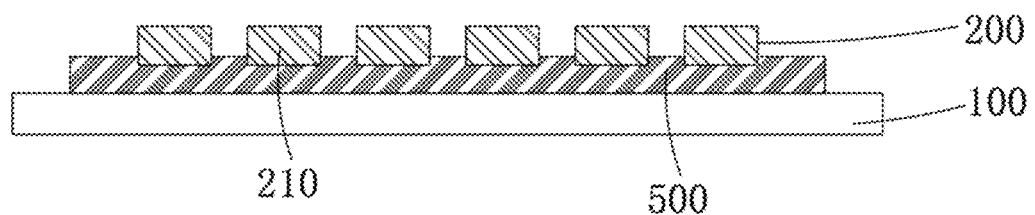
FIG. 3 is a diagram illustrating step S of the manufacturing method of the OLED display panel in accordance with one embodiment of the present disclosure.
Figure 4:
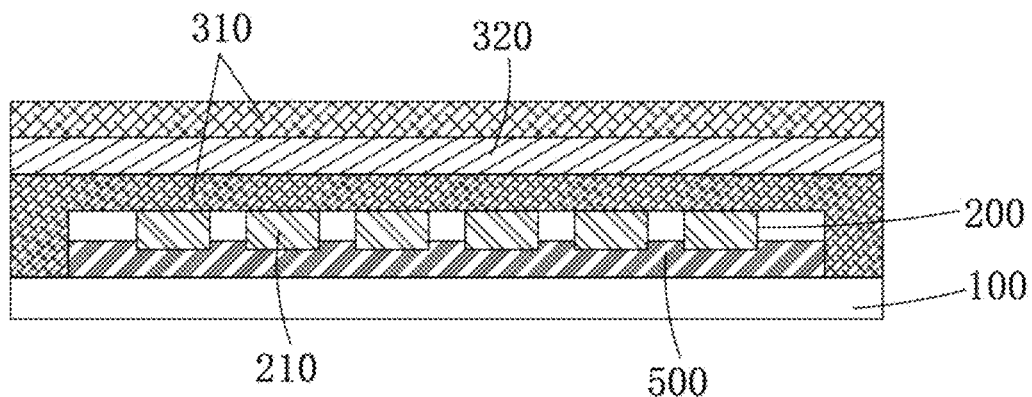
FIG. 4 to FIG. 7 are diagrams illustrating step S2 of the manufacturing method of the OLED display panel in accordance with one embodiment of the present disclosure.
Figure 5:
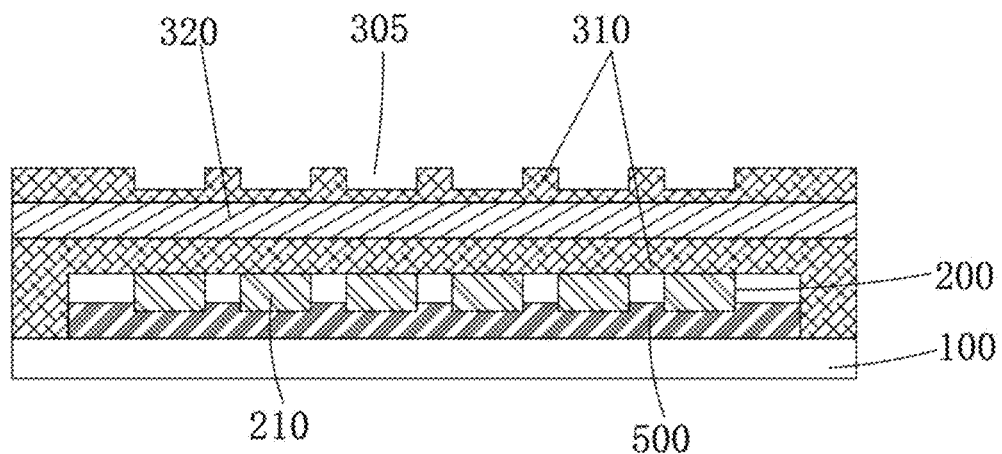
Figure 6:
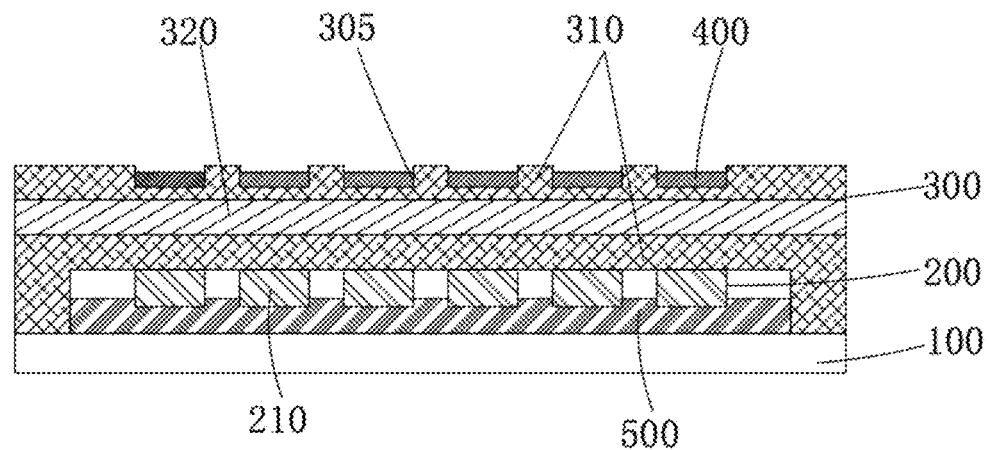
Figure 7:
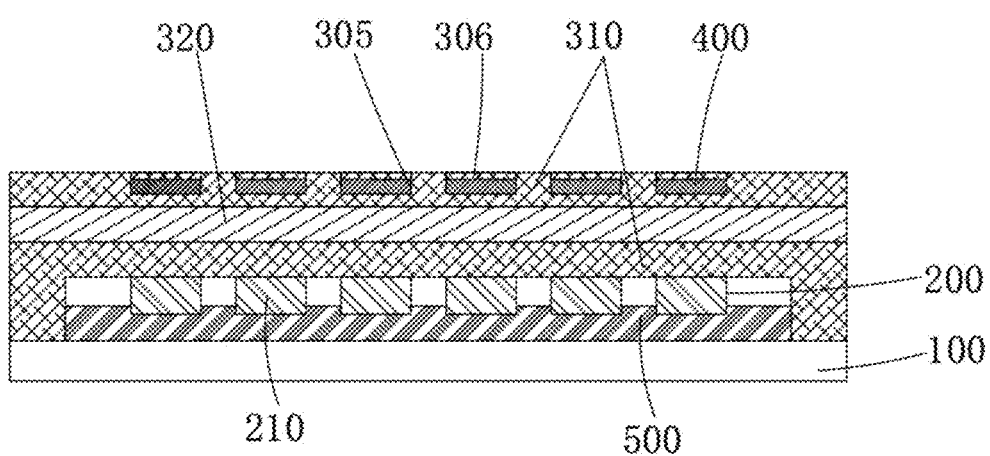

In step S1, referring to FIG. 3, providing the substrate 100, forming the TFT layer 500 on the substrate 100, forming the OLED array layer 200 on the TFT layer 500, wherein the OLED array layer 200 includes the plurality of the OLED components 210 arranged in matrix.

Specifically, the substrate 100 may be the flexible substrate.

In step S2, referring to FIG. 4 to FIG. 7, forming the thin film packaging layer 300 on the substrate 100 and the OLED array layer 200, and forming the light extraction layer 400 within the thin film packaging layer 300 when forming the thin film packaging layer 300, and obtaining the OLED display panel as shown in FIG. 1.

Specifically, the thin film packaging layer 300 may include at least two inorganic barrier layers 310 and at least one organic buffer layer 320. The number of the organic buffer layer 320 is one less than the number of the inorganic barrier layer 310. The inorganic barrier layer 310 and the organic buffer layer 320 are stacked in an alternative manner. The most-bottom layer of the thin film packaging layer 300 is configured to be the inorganic barrier layer 310. When forming the thin film packaging layer 300, the plurality of the pixel grooves 305 are formed on one side of the inorganic barrier layer 310 facing away the substrate 100 after one of the inorganic barrier layers 310 is formed. The plurality of the pixel grooves 305 respectively corresponds to the tops of each of the OLED components 210. Then, the light extraction material is injected into the pixel grooves 305 to form the light extraction layer 400. The inorganic material is filled within the pixel grooves 305 to form the flattening film 306 configured to cover the light extraction layer 400, so as to flatten the surface, having the plurality of the pixel grooves 305, of the inorganic barrier layer 310. As such, the inorganic barrier layer 310 may have a uniform thickness, the light extraction layer 400 may be guaranteed to be configured within the thin film packaging layer 300, the interlayer stress between the light extraction layer 400 and the thin film packaging layer 300, and the damages of the package may be avoided.

In one example, the plurality of the pixel grooves 305 may be configured on the most-bottom layer of the inorganic barrier layer 310. That is the light extraction layer 400 may be configured within the most-bottom layer of the inorganic barrier layer 310. However, this may increase difficulties of manufacturing. Certain damages may be caused on the OLED components 210 during the manufacturing process of the light extraction layer 400 due to the inorganic barrier layer 310 is the closet layer to the OLED array layer 200. In another example, the plurality of the pixel grooves 305 may be configured on the most-top layer of the inorganic barrier layer 310. That is, the light extraction layer 400 is configured within the most-top layer of the inorganic barrier layer 310. However, the light extraction layer 400 is only covered by the flattening film 306, and the light extraction layer 400 may not be perfectly isolated from water vapor and oxygen. Therefore, the thin film packaging layer 300 may include at least two inorganic barrier layers 310. The plurality of the pixel grooves 305 is configured on the inorganic barrier layer 310, which is arranged between the most-top layer and the most-bottom layer of the inorganic barrier layer 310. In other words, the light extraction layer 400 is configured on the middle inorganic barrier layer 310.

In one example, the thin film packaging layer 300 may include three inorganic barrier layers 310. The plurality of the pixel grooves 305 are configured on the second inorganic barrier layer 310 arranged along the direction from the bottom to the top. That is, the light extraction layer 400 is configured within the second inorganic barrier layer 310 arranged along the direction from the bottom to the top.

Specifically, in the step S2, the light extraction material may be titanium dioxide sol, magnesium oxide sol, or the organic solution. The light extraction layer 400 may be manufactured by conducting a coating process, an evaporation process, or a spraying process.

In one example, the flattening film 306 is made of the same material with the inorganic barrier layer 310.

In one example, the inorganic barrier layer 310 is manufactured by conducting a chemical vapor deposition (CVD) process.

In one example, in the step S2, the plurality of the pixel grooves 305 are formed on the inorganic barrier layer 310 by conducting a patterned process. The patterned process includes a photoresist-coating process, an exposure process, a development process, an etching process, and a photoresist-removing process conducted in sequence.

The inorganic barrier layer 310 is made of silicon nitride (SiNx), which is capable of blocking water vapor and oxygen, but the present disclosure is not limited thereto.

The organic buffer layer 320 is made of silicon carbon nitride (SiCN) or silicon oxide carbon (SiOC).

Specifically, the OLED display panel is configured to display color images via the side-by-side structure of the red-colored sub-pixels, the green-colored sub-pixels, and the blue-colored sub-pixels. In one example, the plurality of the OLED components 210 may include: the plurality of the red OLED components, the plurality of the green OLED components, and the plurality of the blue OLED components.

In another example, the OLED display panel is configured to display the color images via the tandem structure including the WOLED and the color filter stacked layer-by-layer. The OLED components 210 are configured to be the white OLED components. The OLED display panel may further include the color filter layer configured within the thin film packaging layer 300.

The present disclosure further relates to the manufacturing method of the OLED display panel configured to manufacture the light extraction layer 400 inside the thin film packaging layer 300. As such, the packaging performance of the thin film packaging layer 300 may not be affected, the stability of the light extraction layer 400 may be improved, the damage of the internal organic film layer, resulting from placing the light extraction layer 400 in the OLED component 210 in the prior art, may be avoided, and the light extraction layer 400 may correspond to the OLED component 210 one-by-one.

In view of the above, the present disclosure relates to the OLED display panel, including: the substrate, the OLED array layer configured on the substrate, the thin film packaging layer configured on the substrate and the OLED array layer, and the light extraction layer configured in the thin film packaging layer. The thin film packaging layer includes the inorganic barrier layer and the organic buffer layer. One side of the inorganic barrier layer includes a plurality of pixel grooves corresponding to tops of each of the OLED components. The light extraction layer is configured within the pixel grooves. The light extraction layer is covered by the flattening film configured to seal the light extraction layer within the pixel groove, so as to flatten the surface of the inorganic barrier layer. As such, the packaging performance of the thin film packaging layer may not be affected, the stability of the light extraction layer may be improved, the light extraction layer may be prevented from being damaged by water vapor and oxygen, and the damage of the internal organic film layer, resulting from placing the light extraction layer in the OLED component in the prior art, may be avoided, and the light extraction layer may correspond to the OLED component one-by-one. The present disclosure further relates to the manufacturing method of the OLED display panel configured to manufacture the light extraction layer inside the thin film packaging layer. As such, the packaging performance of the thin film packaging layer may not be affected, the stability of the light extraction layer may be improved, the damage of the internal organic film layer, resulting from placing the light extraction layer in the OLED component in the prior art, may be avoided, and the light extraction layer may correspond to the OLED component one-by-one.

All other embodiments obtained by a person of ordinary skill in the art based on the embodiments of the present disclosure without creative efforts shall fall within the protection scope of the present disclosure.

What is claimed is:
1. An organic light-emitting diode (OLED) display panel, comprising:
   a substrate;
   an OLED array layer configured on the substrate;
   a thin film packaging layer configured on the substrate and the OLED array layer; and
   a light extraction layer configured within the thin film packaging layer;
   wherein the OLED array layer comprises a plurality of OLED components arranged in matrix, the thin film packaging layer comprises at least two inorganic barrier layers and at least one organic buffer layer, one side of one of the at least two inorganic barrier layers facing away the substrate comprises a plurality of pixel grooves corresponding to tops of OLED devices, the light extraction layer is configured within the pixel grooves, and the light extraction layer is covered by a flattening film configured to seal the light extraction layer within the pixel grooves, so as to flatten a surface of the one of the at least two inorganic barrier layers.

2. The OLED display panel according to claim 1, wherein a number of the organic buffer layers is one less than a number of the inorganic barrier layers in the thin film packaging layer, the inorganic barrier layers and the organic buffer layers are stacked in an alternative manner, and a most-bottom layer of the thin film packaging layer is configured to be an inorganic barrier layer.

3. The OLED display panel according to claim 2, wherein the thin film packaging layer comprises three inorganic barrier layers, the pixel grooves are configured on a second inorganic barrier layer arranged along a direction from a bottom to a top, in the thin film packaging layer, and the light extraction layer is configured within the second inorganic barrier layer arranged along the direction from the bottom to the top.

4. The OLED display panel according to claim 1, wherein the light extraction layer is made of titanium dioxide sol, magnesium oxide sol, or an organic solution;
the flattening film is made of a same material as the at least two inorganic barrier layers;
the at least two inorganic barrier layers are made of silicon nitride; and
the at least one organic buffer layer is made of silicon carbon nitride or silicon oxide carbon.

5. The OLED display panel according to claim 1, further comprising a thin film transistor (TFT) layer configured between the substrate and the OLED array layer, and a color filter layer configured within the thin film packaging layer, wherein the OLED array layer is configured on the TFT layer;
the substrate is a flexible substrate; and
the OLED components comprise: a plurality of red OLED components, a plurality of green OLED components, and a plurality of blue OLED components; or
the OLED components are configured to be white OLED components.

6. A manufacturing method of an OLED display panel, comprising:
providing a substrate; forming an OLED array layer on the substrate, wherein the OLED array layer comprises a plurality of OLED components arranged in matrix;
forming a thin film packaging layer on the substrate and the OLED array layer, and forming a light extraction layer configured within the thin film packaging layer;
wherein the thin film packaging layer comprises at least two inorganic barrier layers and at least one organic buffer layer, a plurality of pixel grooves are formed on one side of one of the at least two inorganic barrier layers facing away the substrate corresponding to tops of each of the OLED components, a light extraction material is deposited within the pixel grooves to form the light extraction layer, and an inorganic material is filled within the pixel grooves to form a flattening film configured to cover the light extraction layer, so as to flatten a surface of the one of the at least two inorganic barrier layers.

7. The manufacturing method according to claim 6, wherein a number of the organic buffer layers is one less than a number of the inorganic barrier layers in the thin film packaging layer, the inorganic barrier layers and the organic buffer layers are stacked in an alternative manner, and a most-bottom layer of the thin film packaging layer is configured to be the inorganic barrier layer;
the at least two inorganic barrier layers are manufactured by conducting a chemical vapor deposition (CVD) process; and
the pixel grooves are formed by conducting a patterning process, wherein the patterned process comprises a photoresist-coating process, an exposure process, a development process, an etching process, and a photoresist-removing process conducted in sequence.

8. The manufacturing method according to claim 7, wherein the thin film packaging layer comprises three inorganic barrier layers, the pixel grooves are configured on a second inorganic barrier layer arranged along a direction from a bottom to a top, in the thin film packaging layer, and the light extraction layer is configured within the second inorganic barrier layer, arranged along the direction from the bottom to the top.

9. The manufacturing method according to claim 6, wherein the light extraction material is titanium dioxide sol, magnesium oxide sol, or an organic solution, and the light extraction material is deposited by conducting a coating process, an evaporation process, or a spraying process;
the flattening film is made of a same material as the at least two inorganic barrier layers;
the at least two inorganic barrier layer is layers are made of silicon nitride; and
the at least one organic buffer layer is made of silicon carbon nitride or silicon oxide carbon.

10. The manufacturing method according to claim 6, further comprising forming a TFT layer on the substrate before forming the OLED array layer and forming a color filter layer configured within the thin film packaging layer, wherein the OLED array layer is configured on the TFT layer;
the substrate is a flexible substrate; and
the OLED components comprise: a plurality of red OLED components, a plurality of green OLED components, and a plurality of blue OLED components; or
the OLED components are configured to be white OLED components.

* * * * *